(12) United States Patent
Huang

(10) Patent No.: US 11,088,346 B2
(45) Date of Patent: Aug. 10, 2021

(54) WOLED DISPLAY PANEL WITH CF LAYER ARRANGED INSIDE THIN-FILM ENCAPSULATION LAYER FOR REDUCING THICKNESS AND ACHIEVING FLEXIBILITY AND MANUFACTURING METHOD THEREOF

(71) Applicant: Shenzhen China Star Optoelectronics Technology Co., Ltd., Shenzhen (CN)

(72) Inventor: Hui Huang, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 455 days.

(21) Appl. No.: 16/307,140

(22) PCT Filed: Sep. 12, 2018

(86) PCT No.: PCT/CN2018/105329
§ 371 (c)(1),
(2) Date: Dec. 5, 2018

(87) PCT Pub. No.: WO2019/205425
PCT Pub. Date: Oct. 31, 2019

(65) Prior Publication Data
US 2021/0098740 A1    Apr. 1, 2021

(30) Foreign Application Priority Data
Apr. 25, 2018    (CN) .......................... 201810381713.5

(51) Int. Cl.
*H01L 29/08*    (2006.01)
*H01L 51/52*    (2006.01)
(Continued)

(52) U.S. Cl.
CPC ........ *H01L 51/5253* (2013.01); *H01L 27/322* (2013.01); *H01L 27/3244* (2013.01); *H01L 51/56* (2013.01); *H01L 2227/323* (2013.01)

(58) Field of Classification Search
CPC ....................................................... H01L 29/08
See application file for complete search history.

(56) References Cited

U.S. PATENT DOCUMENTS 8,044,579 B2 * 10/2011 Nimura ............... H01L 51/5259
                                                                313/506
8,772,824 B2 *  7/2014 Lee ..................... H01L 51/5256
                                                                257/100
(Continued)

FOREIGN PATENT DOCUMENTS

CN         102969334 A    3/2013
CN         103996696 A    8/2014
(Continued)

*Primary Examiner* — Caleb E Henry
(74) *Attorney, Agent, or Firm* — Leong C. Lei

(57) ABSTRACT

The WOLED display panel includes a substrate, a WOLED array layer on the substrate, a thin-film encapsulation layer on the substrate and the WOLED array layer, and a CF layer inside the thin-film encapsulation layer. The thin-film encapsulation layer includes inorganic barrier layers and organic buffer layers. One of the inorganic batter layer has multiple pixel indentations on a side away from the substrate, each corresponding to and above a WOLED device. The CF layer is embedded in the pixel indentations. By having the CF layer inside the thin-film encapsulation layer, the encapsulation cover is omitted, the WOLED display panel's thickness is reduced, and the flexibility of the display panel is achieved. In addition, not only the encapsulation effect is not affected, but also the chroma and color gamut are guaranteed, manufacturing precision is enhanced, and production cost is reduced.

9 Claims, 5 Drawing Sheets

(51) Int. Cl.
    *H01L 27/32*     (2006.01)
    *H01L 51/56*     (2006.01)

(56) References Cited

U.S. PATENT DOCUMENTS

| | | | |
|---|---|---|---|
| 8,928,007 B2* | 1/2015 | Akagawa | H01L 27/3276 257/81 |
| 9,224,700 B2* | 12/2015 | Chen | H01L 51/5256 |
| 9,496,518 B2* | 11/2016 | Kwack | H01L 51/5253 |
| 10,818,876 B2* | 10/2020 | Huang | H01L 51/56 |
| 2007/0114521 A1* | 5/2007 | Hayashi | H01L 51/5246 257/40 |
| 2007/0216288 A1* | 9/2007 | Lin | C09K 11/06 313/504 |
| 2012/0168761 A1* | 7/2012 | Park | H01L 27/1218 257/59 |
| 2012/0256202 A1* | 10/2012 | Lee | H01L 23/31 257/88 |
| 2015/0021559 A1* | 1/2015 | Han | H01L 51/524 257/40 |
| 2018/0183009 A1* | 6/2018 | Chen | H01L 51/5275 |

FOREIGN PATENT DOCUMENTS

| | | |
|---|---|---|
| CN | 105932038 A | 9/2016 |
| CN | 107634149 A | 1/2018 |
| CN | 108470854 A | 8/2018 |

* cited by examiner

WOLED DISPLAY PANEL WITH CF LAYER ARRANGED INSIDE THIN-FILM ENCAPSULATION LAYER FOR REDUCING THICKNESS AND ACHIEVING FLEXIBILITY AND MANUFACTURING METHOD THEREOF

CROSS-REFERENCE TO RELATED APPLICATIONS

This application is a national phase entry of PCT Patent Application No. PCT/CN2018/105329, filed on Sep. 12, 2018, which claims priority to Chinese Patent Application No. 201810381713.5, filed on Apr. 25, 2018, both of which are hereby incorporated herein by reference in their entireties.

BACKGROUND OF THE INVENTION

(a) Technical Field of the Invention

The present invention is generally related to display technologies, and more particular to a white organic light emitting diode (WOLED) display panel and a related manufacturing method.

(b) Description of the Prior Art

Active-matrix flat panel displays are gaining popularity due to their advantages such as thin thickness, power saving, low radiation, etc. Among them, the organic light emitting diode (OLED) display is a promising technology for their superior features such as self-illumination, simplified structure, light weight, fast response, wide viewing angle, low power consumption, and flexibility. The OLED display is therefore referred to as the "dream display." Furthermore, as its production investment is significant less than that for the thin film transistor liquid crystal display (TFT-LCD), the OLED display has become the mainstream product for the third generation's display. Current, the OLED display is at the brink of mass production. As research is continuously developed, it is expected that soon there will be some significant breakthrough for OLED display.

In contrast, the OLED display does not require a backlight. It employs a thin organic material coating on a glass substrate that illuminates when electricity is applied. However, as the organic material is reactive to moist or oxygen, the OLED display has a high requirement on the encapsulation of the OLED devices. Generally, the water vapor transmission rate (WVTR) has to be lower than 10-6 g/m2/day under 85° C. and 85 RH. Therefore, the tight insulation of the encapsulation to the OLED devices from external environment is crucial to the reliability of the OLED display Currently, an OLED device is encapsulated by adhering a rigid encapsulation cover (e.g., glass or metal). This method however does not apply to flexible display panels. Therefore, there are solutions that encapsulating the OLED device through stacking films. This method forms multiple barrier layers on the OLED device. These layers are made of inorganic material and provide superior air and water tightness. A buffer layer of great flexibility made of organic material is formed between neighboring barrier layers.

To achieve full-color OLED display, a solution is to provide a side-by-side structure of independently illuminating RGB sub-pixels. Another solution is to provide white organic light emitting diode (WOLED) and color filter (CD) in a tandem WOLED+CF structure. For WOLED, two or more light generation layers connected by charge generation layer (CGL) and emit white light. Then individual RGB lights are obtained after the filter of the CF layer. This solution is said to have a tandem structure as the light generation layers are stacked. An OLED display of high resolution may be conveniently achieved as the stacking of WOLED and CF layer does not require precise masking technique. This solution may also avoid the color distortion problem resulted from OLED device's R, G and B elements of different operation lives. It is also appropriate for manufacturing high-resolution panels. Therefore, WOLED has huge potential of large-scale OLED display panels.

Current WOLED display panels often adopt encapsulation using a cover and CF layer is formed on the cover, as shown in the structural schematic diagram of FIG. 1. As illustrated, the WOLED display panel includes a substrate 20, a TFT layer 21 on the substrate 20, a WOLED array layer 22 on the TFT layer 21, a cover plate 10 opposite to the substrate 20, a CF layer 11 on a side of the cover plate 10 facing the substrate 20, and sealing adhesive 30 joining the cover plate 10 and the substrate 20. This structure is more complex and is not appropriate for flexible display as it is thicker due to the two layers of cover plate 10 and substrate 20.

SUMMARY OF THE INVENTION

An objective of the present invention is to provide a WOLED display panel where the CF layer is inside the thin-film encapsulation layer. As such, the encapsulation cover is omitted, the WOLED display panel's thickness is reduced, and the flexibility of the display panel is achieved. In addition, not only the encapsulation effect is not affected, but also the production cost is reduced.

Another objective of the present invention is to provide a WOLED display panel manufacturing method where the CF layer is formed inside the thin-film encapsulation layer. As such, the encapsulation cover is omitted, the WOLED display panel's thickness is reduced, and the flexibility of the display panel is achieved. In addition, not only the encapsulation effect is not affected, but also the production cost is reduced.

To achieve the objective, the WOLED display panel includes a substrate, a WOLED array layer on the substrate, a thin-film encapsulation layer on the substrate and the WOLED array layer, and a CF layer inside the thin-film encapsulation layer.

The WOLED array layer includes a number of WOLED devices arranged in an array.

The thin-film encapsulation layer includes at least two inorganic barrier layers and at least an organic buffer layer. One of the inorganic barrier layers has a number of pixel indentations on a side farther away from the substrate, each corresponding to and above a WOLED device.

The CF layer is configured in the pixel indentations and includes a number of color-resist units, each embedded in a pixel indentation.

Inside the thin-film encapsulation layer, if there are a number of organic buffer layers, the number of the organic buffer layers is one less than the number of the inorganic barrier layers. The inorganic barrier layers and the organic buffer layers are stacked alternately. A bottommost layer inside the thin-film encapsulation layer is an inorganic barrier layer which is also the first inorganic barrier layer.

The pixel indentations are configured on the first inorganic barrier layer.

Inside the thin-film encapsulation layer, the number of inorganic barrier layers is two; and the number of the organic buffer layer is one.

The CF layer is made of dichromated gelatin.

The color-resist units include a number of red color-resist units, a number of green color-resist units, and a number of blue color-resist units.

The inorganic barrier layers are made of SiNx.

The at least one organic buffer layer is made of SiCN or SiOC.

The WOLED display panel further includes a TFT layer disposed between the substrate and the WOLED array layer, and the WOLED array layer is disposed on the TFT layer.

The WOLED display panel manufacturing method includes the following steps.

Step S1 provides a substrate and forms a WOLED array layer on the substrate, where the WOLED array layer includes a number of WOLED devices arranged m an array.

Step S2 forms a thin-film encapsulation layer on the substrate and the WOLED array layer, where, in the process of forming the thin-film encapsulation layer, a CF layer is formed inside the thin-film encapsulation layer.

The thin-film encapsulation layer includes at least two inorganic barrier layers and at least an organic buffer layer. In forming the thin-film encapsulation layer, a number of pixel indentations are formed on a side of one of the inorganic barrier layers farther away from the substrate. Each pixel indentation corresponds to and is above a WOLED device. A number of color-resist units are formed in the pixels indentations, respectively, thereby obtaining the CF layer.

Inside the thin-film encapsulation layer, if there are a number of organic buffer layers, the number of the organic buffer layers is one less than the number of the inorganic barrier layers. The inorganic barrier layers and the organic buffer layers are stacked alternately. A bottommost layer inside the thin-film encapsulation layer is an inorganic barrier layer which is also the first inorganic barrier layer.

The pixel indentations are configured on the first inorganic barrier layer.

The inorganic barrier layers are formed using Chemical Vapor Deposition (CVD).

Within the step S2, the multiple pixel indentations are formed on the first inorganic barrier layer through a lithographic means, and the lithographic means includes sequentially conducted photoresist coating, exposure, development, etching, and photoresist removal.

Inside the thin-film encapsulation layer, the number of inorganic barrier layers is two, and the number of the organic buffer layer is one.

The color-resist units include a number of red color-resist units, a number of green color-resist units, and a number of blue color-resist units. The CF layer is made of dichromated gelatin. In forming the CF layer, the pixel indentations are filled with dichromated gelatin, the dichromated gelatin within the pixel indentations is then exposed to red, green, and blue lights, respectively, so as to form the red, green, and blue color-resist units.

The inorganic barrier layers are made of SiNx.

The at least one organic buffer layer is made of SiCN or SiOC.

The step S1 further includes a step of forming a TFT layer on the substrate before forming the WOLED array layer, where the WOLED is subsequently formed on the TFT layer.

The advantages of the present invention are as follows. The WOLED display panel includes a substrate, a WOLED array layer on the substrate, a thin-film encapsulation layer on the substrate and the WOLED array layer, and a CF layer inside the thin-film encapsulation layer. The thin-film encapsulation layer includes inorganic barrier layers and organic buffer layers. One of the inorganic batter layer has multiple pixel indentations on a side away from the substrate, each corresponding to and above a WOLED device. The CF layer is embedded in the pixel indentations. By having the CF layer inside the thin-film encapsulation layer, the encapsulation cover is omitted, the WOLED display panel's thickness is reduced, and the flexibility of the display panel is achieved. In addition, not only the encapsulation effect is not affected, but also the chroma and color gamut are guaranteed, manufacturing precision is enhanced, and production cost is reduced. The WOLED display panel manufacturing method has the CF layer formed inside the thin-film encapsulation layer. As such, the encapsulation cover is omitted, the WOLED display panel's thickness is reduced, and the flexibility of the display panel is achieved. In addition, not only the encapsulation effect is not affected, but also the production cost is reduced.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention.

Various changes to the described embodiments may be made in the function and arrangement of the elements described without departing from the scope of the invention as set forth in the appended claims.

Figure 1:
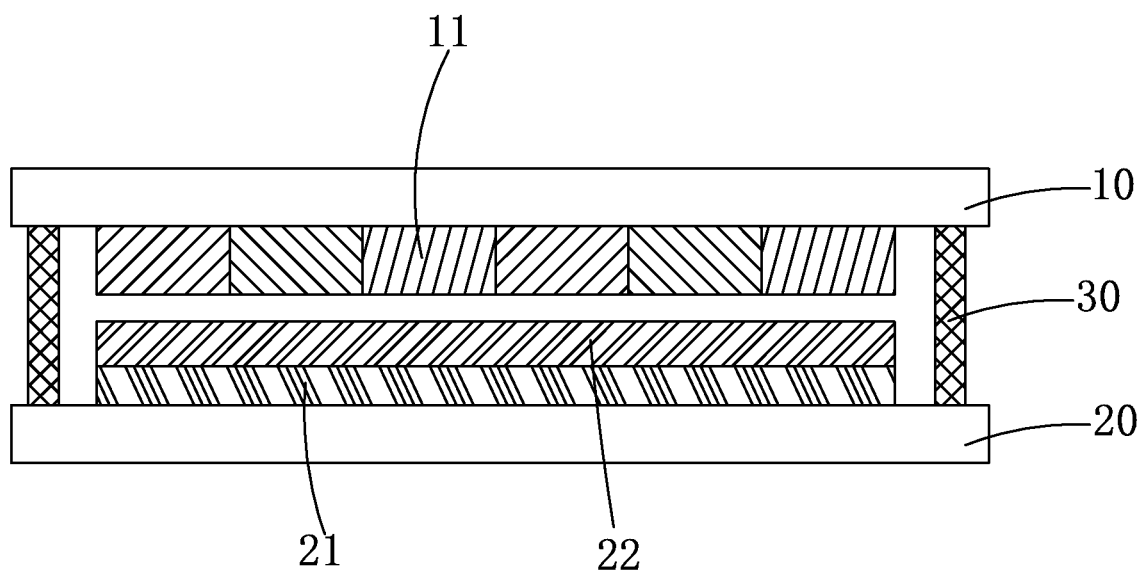
FIG. 1 is a schematic structural diagram showing a conventional WOLED display panel.
Figure 2:
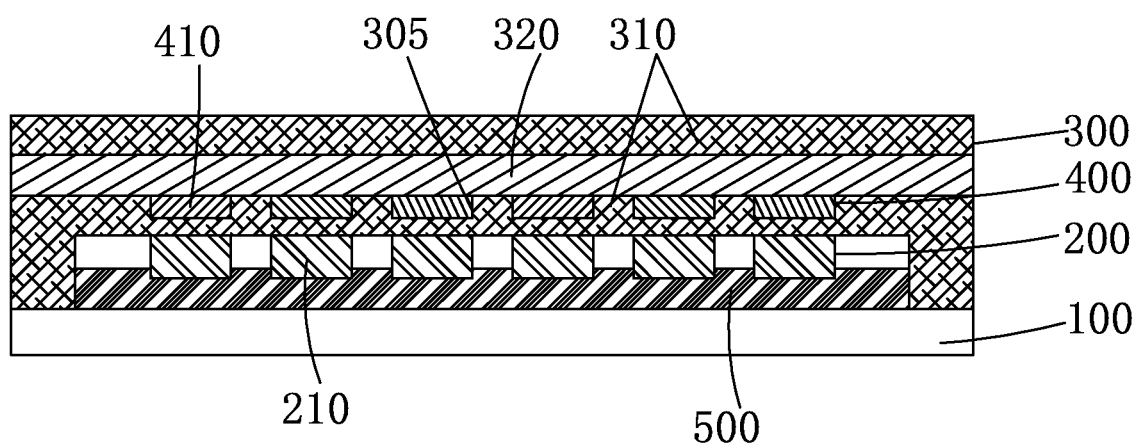
FIG. 2 is a schematic structural diagram showing a WOLED display panel according to an embodiment of the present invention.

As shown in FIG. 2, a WOLED display panel according to an embodiment of the present invention includes a substrate 100, a TFT layer 500 on the substrate 100, a WOLED array layer 200 on the TFT layer 500, a thin-film encapsulation layer 300 on the substrate 100 and the WOLED array layer 200 covering the WOLED array layer 200, and a CF layer 400 inside the thin-film encapsulation layer 300.

The WOLED array layer 200 includes multiple WOLED devices 210 disposed in an array.

The thin-film encapsulation layer 300 includes at least two inorganic barrier layers 310 and at least an organic buffer layer 320. The number of organic buffer layers 320 is one less than that of the inorganic barrier layers 310. The inorganic barrier layers 310 and the organic buffer layers 320 are stacked alternately, where the bottommost layer is an inorganic barrier layer 310 which is also the first inorganic barrier layer 310. Except the topmost inorganic barrier layer 310, one of the other inorganic barrier layers 310 has a number of pixel indentations 305 on a side, each corresponding to and above a WOLED device 210.

The CF layer 400 includes a number of color-resist units 410, each embedded in a pixel indentation 305.

In the present embodiment, there are two inorganic barrier layers 310. The pixel indentations 305 are configured on the first inorganic barrier layer 310.

The color-resist units 410 includes a number of red color-resist units, a number of green color-resist units, and a number of blue color-resist units.

The CF layer 400 is made of dichromated gelatin. The red, green, and blue color-resist units are formed by exposing the dichromated gelatin within the pixel indentations 305 to red, green, and blue lights, respectively.

The inorganic barrier layers 310 are preferably made of SiNx, but it not limited as such. SiNx has superior air and water tightness.

The organic buffer layers 320 are made of SiCN or SiOC.

The WOLED display panel of the present embodiment has the CF layer 400 disposed inside the thin-film encapsulation layer 300, thereby omitting the cover, reducing the thickness and facilitating the flexibility of the display panel. In addition, the inclusion of the CF layer 400 within the thin-film encapsulation layer 300 not only does not compromise the latter's encapsulation effect, but also guarantees the chroma and color gamut of the WOLED display panel, enhances manufacturing precision, and reduces production cost.

Figure 3:
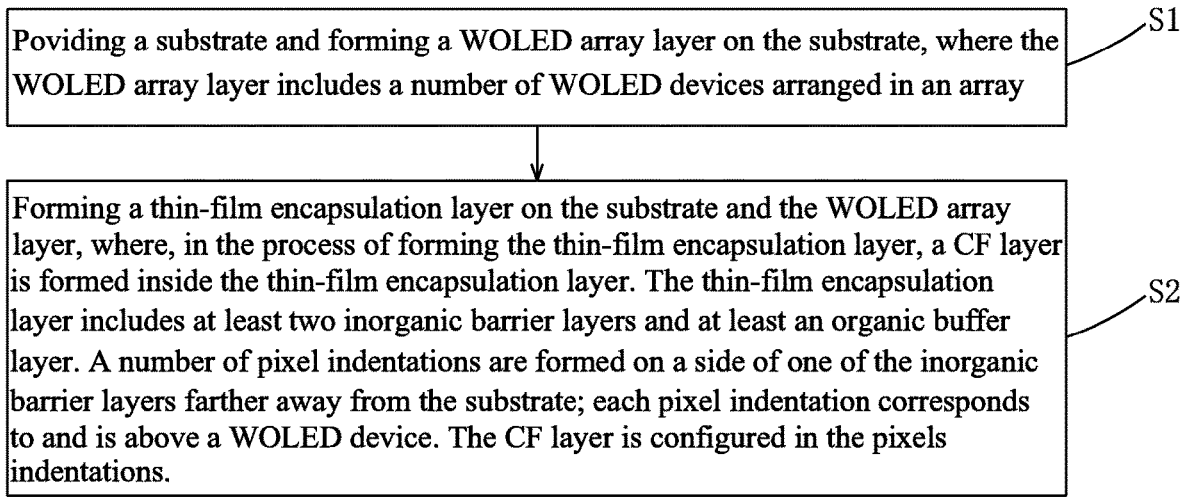
FIG. 3 is a flow diagram showing the steps of a WOLED display panel manufacturing method according to an embodiment of the present invention.

As shown in FIG. 3, the present invention also discloses a WOLED display panel manufacturing method, which includes the following steps.

Figure 4:
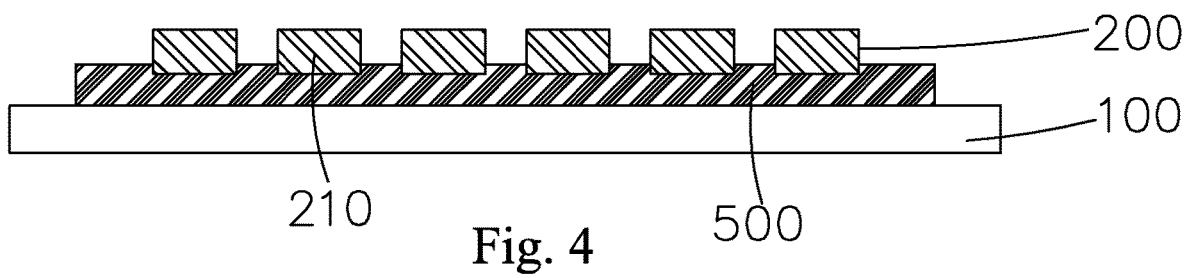
FIG. 4 is a schematic structural diagram showing a step S1 of the method of FIG. 3.
Figure 5:
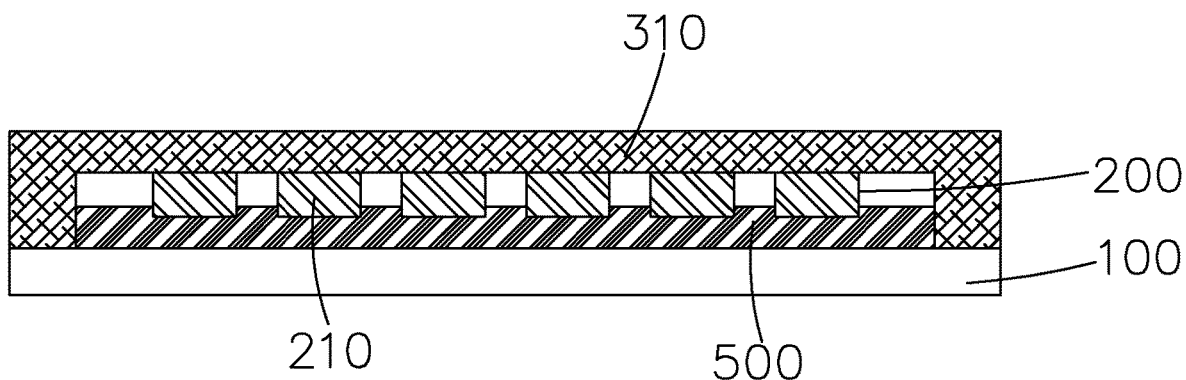
FIGS. 5 to 8 are schematic structural diagrams showing a step S2 of the method of FIG. 3.
Figure 6:
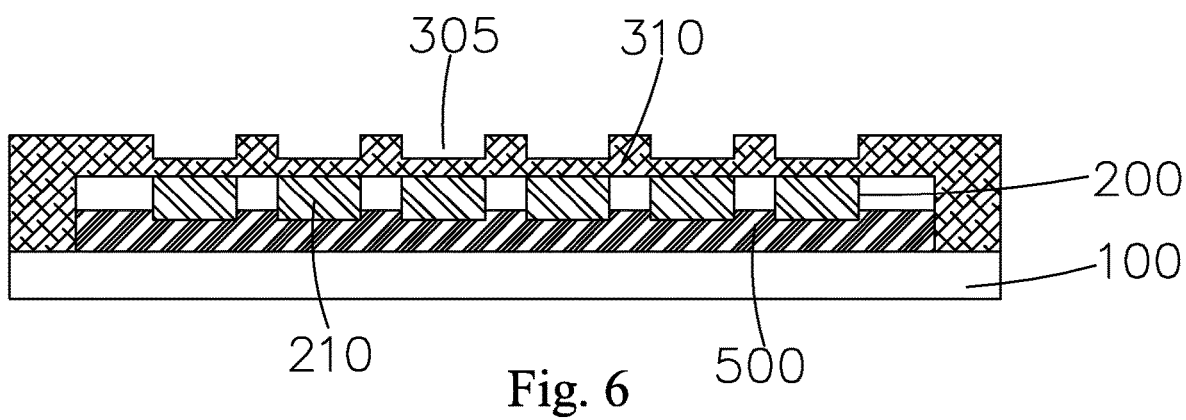
Figure 7:
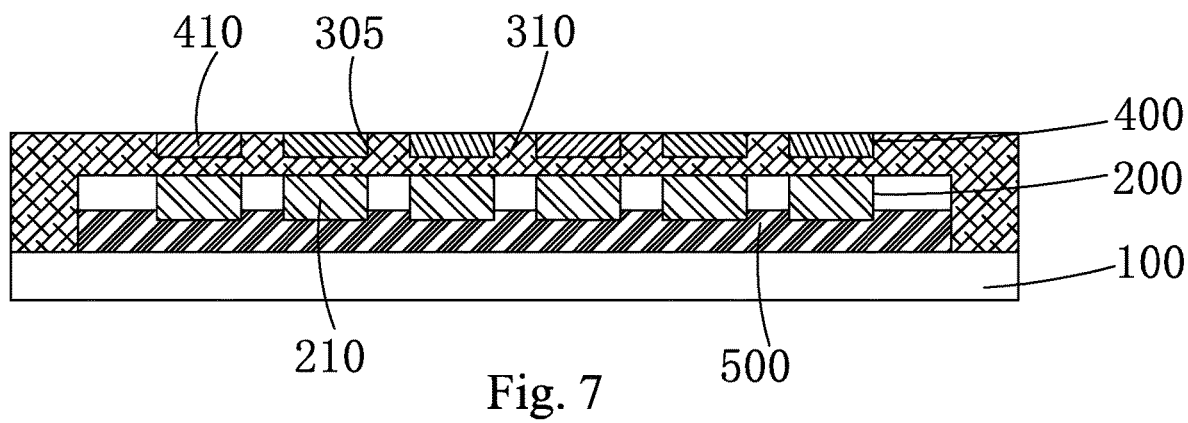
Figure 8:
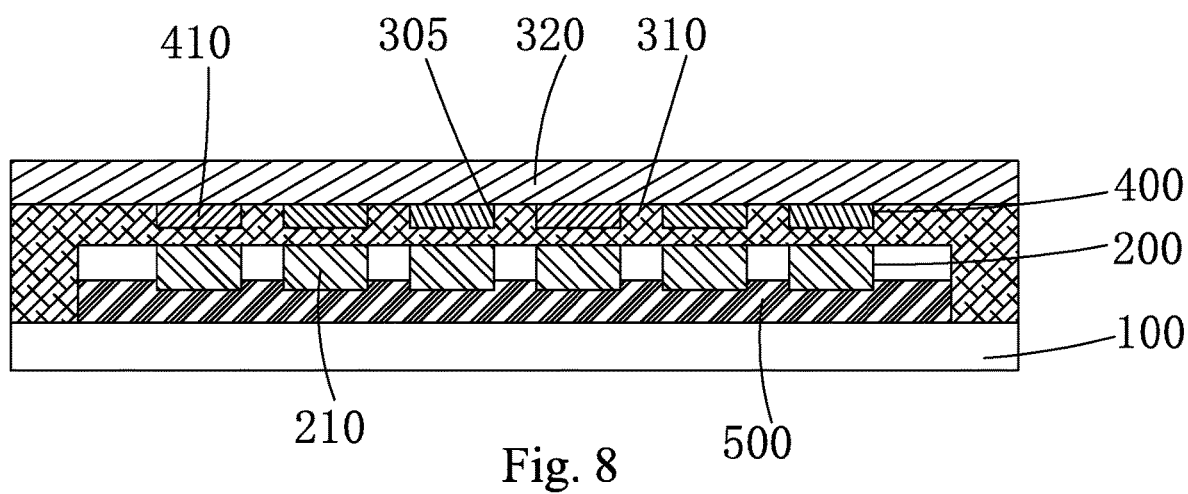

In step S1, as shown in FIG. 4, a substrate 100 provided, a TFT layer 500 is formed on the substrate 100, and a WOLED array layer 200 is formed on the TFT layer 500. The WOLED array layer 200 includes multiple WOLED devices 210 disposed in an array.

In step S2, as shown in FIGS. 5 to 8, a thin-film encapsulation layer 300 is formed on the substrate 100 and the WOLED array layer 200. In the process, a CF layer 400 is formed inside the thin-film encapsulation layer 300, thereby obtaining the WOLED display panel shown in FIG. 2.

The thin-film encapsulation layer 300 includes at least two inorganic barrier layers 310 and at least an organic buffer layer 320. The number of organic buffer layers 320 is one less than that of the inorganic barrier layers 310. The inorganic barrier layers 310 and the organic buffer layers 320 are stacked alternately, where the bottommost layer is an inorganic barrier layer 310 which is also the first inorganic barrier layer 310. In forming the thin-film encapsulation layer 300, except the topmost inorganic barrier layer 310, a number of pixel indentations 305 are formed on a side of one of the other inorganic barrier layers 310 after the inorganic barrier layers 310 is formed. Each pixel indentation 305 corresponds to and is above a WOLED device 210. Then, multiple color-resist units 410 are formed in the pixels indentations 305, thereby obtaining the CF layer 400.

In the present embodiment, there are two inorganic barrier layers 310. The pixel indentations 305 are configured on the first inorganic barrier layer 310.

The inorganic barrier layers 310 are formed using Chemical Vapor Deposition (CVD).

Within the step S2, the multiple pixel indentations 305 are formed on the first inorganic barrier layer 310 through lithographic means. The lithographic means includes sequentially conducted steps such as photoresist coating, exposure, development, etching, and photoresist removal.

The CF layer 400 is made of dichromated gelatin. In forming the CF layer 400, the pixel indentations 305 are filled with dichromated gelatin. The dichromated gelatin within the pixel indentations 305 is then exposed to red, green, and blue lights, respectively, so as to form a number of red color-resist units, a number of green color-resist units, and a number of blue color-resist units. In addition, the CF layer 400 may also be formed using other materials through coating, evaporation, spray coating, etc.

The inorganic barrier layers 310 are preferably made of SiNx, but it not limited as such. SiNx has superior air and water tightness.

The organic buffer layers 320 are made of SiCN or SiOC.

The WOLED display panel manufacturing method of the present embodiment has the CF layer 400 formed inside the thin-film encapsulation layer 300, thereby omitting the cover, reducing the thickness and facilitating the flexibility of the display panel. In addition, the encapsulation effect is not affected, and production cost is reduced.

As described, the present invention provides a WOLED display panel including a substrate, a WOLED array layer on the substrate, a thin-film encapsulation layer on the substrate and the WOLED array layer, and a CF layer inside the thin-film encapsulation layer. The thin-film encapsulation layer includes inorganic barrier layers and organic buffer layers. One of the inorganic batter layer has multiple pixel indentations on a side away from the substrate, each corresponding to and above a WOLED device. The CF layer is embedded in the pixel indentations. By having the CF layer inside the thin-film encapsulation layer, the conventional encapsulation cover is omitted, the WOLED display panel's thickness is reduced, and the flexibility of the display panel is achieved. In addition, the inclusion of the CF layer within the thin-film encapsulation layer not only does not compromise the latter's encapsulation effect, but also guarantees the chroma and color gamut of the WOLED display panel, enhances manufacturing precision, and reduces production cost. The present invention also provides a WOLED display panel manufacturing method, where the CF layer is formed inside the thin-film encapsulation layer, thereby omitting the cover, reducing the thickness and facilitating the flexibility of the display panel. In addition, the encapsulation effect is not affected, and production cost is reduced.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A white organic light emitting diode (WOLED) display panel, comprising a substrate, a WOLED array layer on the substrate, a thin-film encapsulation layer on the substrate and the WOLED array layer, and a color filter (CF) layer inside the thin-film encapsulation layer, wherein
the WOLED array layer comprises a plurality of WOLED devices arranged in an array;
the thin-film encapsulation layer comprises at least two inorganic barrier layers and at least an organic buffer layer;
one of the inorganic barrier layers has a plurality of pixel indentations on a side farther away from the substrate, each corresponding to and above a WOLED device; and
the CF layer is configured in the pixel indentations and comprises a plurality of color-resist units, each embedded in a pixel indentation;
wherein, inside the thin-film encapsulation layer, if there are a plurality of organic buffer layers, the number of the organic buffer layers is one less than the number of the inorganic barrier layers; the inorganic barrier layers and the organic buffer layers are stacked alternately; a bottommost layer inside the thin-film encapsulation layer is an inorganic barrier layer which is also the first inorganic barrier layer; and the pixel indentations are configured on the first inorganic barrier layer.

2. The WOLED display panel according to claim 1, wherein, inside the thin-film encapsulation layer, the number of inorganic barrier layers is two; and the number of the organic buffer layer is one.

3. The WOLED display panel according to claim 1, wherein the CF layer is made of dichromated gelatin; the color-resist units comprise a plurality of red color-resist units, a plurality of green color-resist units, and a plurality of blue color-resist units; the inorganic barrier layers are made of SiNx; and the at least one organic buffer layer is made of SiCN or SiOC.

4. The WOLED display panel according to claim 1, further comprising a thin film transistor (TFT) layer disposed between the substrate and the WOLED array layer; and the WOLED array layer is disposed on the TFT layer.

5. A WOLED display panel manufacturing method, comprising
S1: providing a substrate and forming a WOLED array layer on the substrate, where the WOLED array layer comprises a plurality of WOLED devices arranged in an array; and S2: forming a thin-film encapsulation layer on the substrate and the WOLED array layer, where, in the process of forming the thin-film encapsulation layer, a CF layer is formed inside the thin-film encapsulation layer;
wherein the thin-film encapsulation layer comprises at least two inorganic barrier layers and at least an organic buffer layer; in forming the thin-film encapsulation layer, a plurality of pixel indentations are formed on a side of one of the inorganic barrier layers farther away from the substrate; each pixel indentation corresponds to and is above a WOLED device; and a plurality of color-resist units are formed in the pixels indentations, respectively, thereby obtaining the CF layer.

6. The WOLED display panel manufacturing method according to claim 5, wherein, inside the thin-film encapsulation layer, if there are a plurality of organic buffer layers, the number of the organic buffer layers is one less than the number of the inorganic barrier layers; the inorganic barrier layers and the organic buffer layers are stacked alternately; a bottommost layer inside the thin-film encapsulation layer is an inorganic barrier layer which is also the first inorganic barrier layer; the pixel indentations are configured on the first inorganic barrier layer; and the inorganic barrier layers are formed using Chemical Vapor Deposition (CVD); and, within the step S2, the multiple pixel indentations are formed on the first inorganic barrier layer through a lithographic means, and the lithographic means comprises sequentially conducted photoresist coating, exposure, development, etching, and photoresist removal.

7. The WOLED display panel manufacturing method according to claim 6, wherein, inside the thin-film encapsulation layer, the number of inorganic barrier layers is two; and the number of the organic buffer layer is one.

8. The WOLED display panel manufacturing method according to claim 5, wherein the color-resist units comprise a plurality of red color-resist units, a plurality of green color-resist units, and a plurality of blue color-resist units; the CF layer is made of dichromated gelatin; in forming the CF layer, the pixel indentations are filled with dichromated gelatin, the dichromated gelatin within the pixel indentations is then exposed to red, green, and blue lights, respectively, so as to form the red, green, and blue color-resist units; the inorganic barrier layers are made of SiNx; and the at least one organic buffer layer is made of SiCN or SiOC.

9. The WOLED display panel manufacturing method according to claim 5, where the step S1 further comprises
forming a TFT layer on the substrate before forming the WOLED array layer, where the WOLED is subsequently formed on the TFT layer.

* * * * *